(12) United States Patent
Ranjan et al.

(10) Patent No.: US 10,290,506 B2
(45) Date of Patent: May 14, 2019

(54) METHOD FOR ETCHING HIGH-K DIELECTRIC USING PULSED BIAS POWER

(71) Applicant: Tokyo Electron Limited, Tokyo (JP)

(72) Inventors: Alok Ranjan, Mechanicville, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 15/431,049

(22) Filed: Feb. 13, 2017

(65) Prior Publication Data
US 2017/0154781 A1 Jun. 1, 2017

Related U.S. Application Data

(63) Continuation of application No. 14/869,330, filed on Sep. 29, 2015, now Pat. No. 9,570,313, which is a continuation of application No. 14/282,716, filed on May 20, 2014, now Pat. No. 9,159,575, which is a
(Continued)

(51) Int. Cl.
H01L 21/3065 (2006.01)
H01L 21/311 (2006.01)
H01L 21/28 (2006.01)
H01L 29/51 (2006.01)
H01L 21/67 (2006.01)
(Continued)

(52) U.S. Cl.
CPC ...... *H01L 21/3065* (2013.01); *H01J 37/3211* (2013.01); *H01J 37/3222* (2013.01); *H01J 37/3244* (2013.01); *H01J 37/32082* (2013.01); *H01J 37/32137* (2013.01); *H01J 37/32146* (2013.01); *H01J 37/32165* (2013.01); *H01J 37/32449* (2013.01); *H01J 37/32697* (2013.01); *H01J 37/32706* (2013.01); *H01L 21/28123* (2013.01); *H01L 21/31116* (2013.01); *H01L 21/31122* (2013.01); *H01L 21/67069* (2013.01); *H01L 21/6831* (2013.01); *H01L 29/517* (2013.01); *H01L 29/518* (2013.01); *H01J 2237/334* (2013.01)

(58) Field of Classification Search
None
See application file for complete search history.

(56) References Cited

U.S. PATENT DOCUMENTS 6,589,437 B1 * 7/2003 Collins ............... H01J 37/321
216/67
7,166,233 B2 1/2007 Johnson et al.
7,199,328 B2 4/2007 Strang
(Continued)

OTHER PUBLICATIONS

M. Darnon et al, Synchronous Pulsed Plasma for Silicon Etch Applications, ECS Translations, vol. 27(1), 2010, pp. 717-723.
(Continued)

*Primary Examiner* — Stephanie P Duclair
(74) *Attorney, Agent, or Firm* — Wood Herron & Evans LLP

(57) ABSTRACT

A method of patterning a gate stack on a substrate is described. The method includes preparing a gate stack on a substrate, wherein the gate stack includes a high-k layer and a gate layer formed on the high-k layer. The method further includes transferring a pattern formed in the gate layer to the high-k layer using a pulsed bias plasma etching process, and selecting a process condition for the pulsed bias plasma etching process to achieve a silicon recess formed in the substrate having a depth less than 2 nanometer (nm).

23 Claims, 17 Drawing Sheets

Related U.S. Application Data continuation of application No. 13/217,489, filed on Aug. 25, 2011, now Pat. No. 8,735,291.

(51) Int. Cl.
*H01L 21/683* (2006.01)
*H01J 37/32* (2006.01)

(56) References Cited

U.S. PATENT DOCUMENTS

| | | |
|---|---|---|
| 8,183,161 B2 | 5/2012 | Fernandez et al. |
| 2004/0132311 A1 | 7/2004 | Nallan et al. |
| 2008/0064220 A1 | 3/2008 | Fernandez et al. |
| 2008/0110859 A1 | 5/2008 | Koshiishi et al. |
| 2010/0213162 A1* | 8/2010 | Mochiki ........... H01J 37/32027 216/17 |
| 2011/0045672 A1 | 2/2011 | Srinivasan et al. |
| 2011/0309049 A1 | 12/2011 | Papasouliotis et al. |
| 2012/0302065 A1 | 11/2012 | Lin et al. |

OTHER PUBLICATIONS

Korzec et al, Journal of Vac. Sci. Technol A 13(4), Jul./Aug. 1995.
Sugai et al., Plasma Sources Sci. Technol. 7, (1998) 192-205.
Werner, F., et al., Surface Wave Operation Mode of the Slot Antenna Microwave Plasma Source SLAN, J. Vac. Sci. Technol. A 14(6), Nov./Dec. 1996, pp. 3065-3070.

\* cited by examiner

METHOD FOR ETCHING HIGH-K DIELECTRIC USING PULSED BIAS POWER

CROSS-REFERENCE TO RELATED APPLICATION

This application is a continuation of co-pending U.S. patent application Ser. No. 14/869,330 filed Sep. 29, 2015 (issued as U.S. Pat. No. 9,570,313 on Feb. 14, 2017) and entitled METHOD FOR ETCHING HIGH-K DIELECTRIC USING PULSED BIAS POWER, which is a continuation of U.S. patent application Ser. No. 14/282,716 filed on May 20, 2014 (issued as U.S. Pat. No. 9,159,575 on Oct. 13, 2015) and entitled METHOD FOR ETCHING HIGH-K DIELECTRIC USING PULSED BIAS POWER, which is a continuation of U.S. patent application Ser. No. 13/217,489 filed on Aug. 25, 2011 (issued as U.S. Pat. No. 8,735,291 on May 27, 2014) and entitled METHOD FOR ETCHING HIGH-K DIELECTRIC USING PULSED BIAS POWER, the disclosures of which are incorporated herein by reference in their entirety as if completely set forth herein below.

BACKGROUND OF THE INVENTION

Field of Invention

The invention relates to a method for pattern etching a gate stack layer on a substrate.

Description of Related Art

As the size of semiconductor devices is reduced, process development and integration issues are key challenges for new gate materials including high-permittivity (or high dielectric constant) dielectric materials (also referred to herein as high-k materials).

Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiN_xO_y$). High-k materials may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)).

For front-end-of-line (FEOL) operations, these high-k materials are contemplated for integration with polycrystalline silicon (polysilicon) gate structures and, in the longer term, they are contemplated for use with metal gates. However, the integration of high-k materials with gate structures has posed substantive challenges during the patterning of the gate structure. In particular, conventional etching processes suffer from poor profile control and substrate recess formation during pattern transfer.

SUMMARY OF THE INVENTION

Embodiments of the invention relate to a method for pattern etching a gate stack layer on a substrate. Other embodiments of the invention relate to a method for pattern etching a high-k (high dielectric constant, k) layer on a substrate while, among other things, reducing or avoiding: (A) under-cutting of the layer overlying the high-k layer, (B) forming a footing in the high-k layer, and (C) forming a recess in the substrate.

According to one embodiment, a method of patterning a gate stack on a substrate is described. The method includes preparing a gate stack on a substrate, wherein the gate stack includes a high-k layer and a gate layer formed on the high-k layer. The method further includes transferring a pattern formed in the gate layer to the high-k layer using a pulsed bias plasma etching process, and selecting a process condition for the pulsed bias plasma etching process to achieve a silicon recess formed in the substrate having a depth less than 2 nanometer (nm). The pulsed bias plasma etching process includes: forming plasma using a process gas composition including a halogen-containing gas and a polymerizing gas, wherein the polymerizing gas contains a hydrocarbon; electrically biasing a substrate holder that supports the substrate with radio frequency (RF) power; and pulsing the RF power for the electrical biasing.

DETAILED DESCRIPTION OF SEVERAL EMBODIMENTS

Figure 1A:
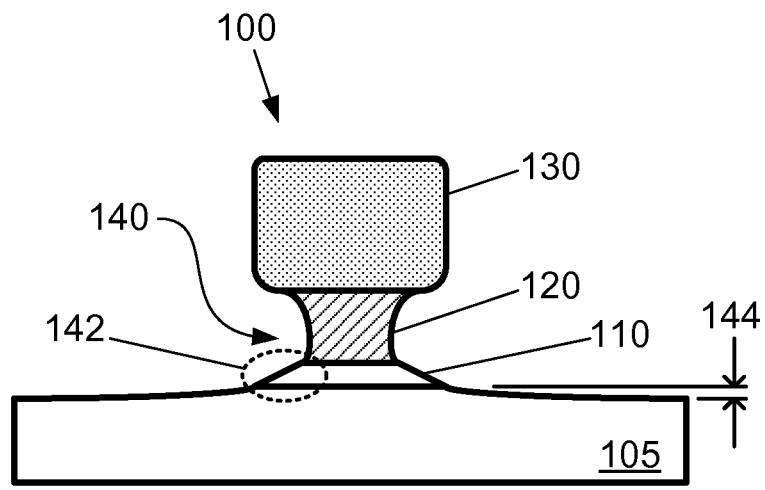
FIGS. 1A through 1B illustrate a schematic representation of a patterned gate structure on a substrate.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, pattern etching can comprise the application of a thin layer of radiation-sensitive material, such as photo-resist, to an upper surface of a substrate, followed by patterning of the thin layer of material using lithographic techniques. During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular constituents of the process gas. Using a series of dry etching processes, the pattern formed in the thin layer of radiation-sensitive material is transferred to the underlying layers within a film stack, including the one or more material layers that are desired for the end product, e.g., electronic device. Among other things, during the pattern transfer process, profile control for the pattern extended into underlying layers is of critical importance.

Figure 1B:
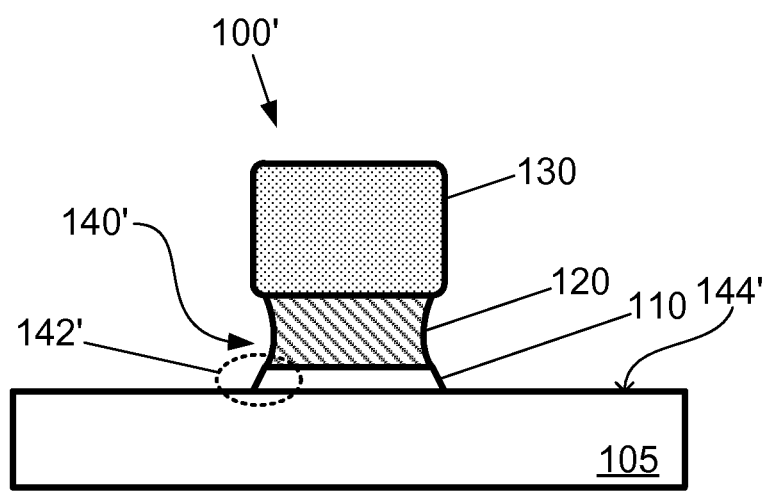

For example, as shown in FIGS. 1A and 1B, a gate structure 100 is prepared, wherein the gate structure 100 begins with forming a film stack having a plurality of layers (i.e., layers 110 through 130) on a substrate 105. The gate structure 100 may, for example, include a metal-containing gate having a gate dielectric layer 110, a first gate layer 120 overlying gate dielectric layer 110, and a second gate layer 130 overlying the first gate layer 120. The gate dielectric layer 110 may include one or more layers including, for example, a high dielectric constant (high-k) layer and an interfacial layer located between the high-k layer and the substrate 105. The first gate layer 120 may include a metal-containing layer, such as a metal or metal alloy. The second gate layer 130 may also include a metal-containing layer, such as a metal or metal alloy. For example, the second gate layer 130 may include a low resistance metal, such as tungsten. Alternatively, the first gate layer 120 and/or the second gate layer 130 may include poly-crystalline silicon.

As illustrated in FIG. 1A, a conventional etch process sequence causes severe profile under-cutting 140 of the second gate layer 130. During pattern transfer to the gate dielectric layer 110, poor etch selectivity between the gate dielectric layer 110 and the first gate layer 120 leads to isotropic erosion of the first gate layer 120. Additionally, a conventional etch process sequence causes formation of a footing 142 in the gate dielectric layer, and a recess 144 in the substrate 105. In FIG. 1B, a gate structure 100' is illustrated depicting reduction of the profile under-cutting 140', reduction of the footing 142', and reduction of the recess 144' provided by embodiments of the invention.

Therefore, according to an embodiment, a method for patterning a gate stack on a substrate is illustrated in FIGS. 2A through 2E, and FIG. 3. As described in FIG. 3 and illustrated pictorially in FIG. 2A, the method comprises a flow chart 300 beginning in 310 with preparing a gate stack for a gate structure 200 on a substrate 210, wherein the gate structure 200 includes a high dielectric constant (high-k) layer 230 as a gate dielectric, a first gate layer 240 formed on the high-k layer 230, and a second gate layer 250 formed on the first gate layer 240. The first gate layer 240 and the second gate layer 250 may, for example, be part of a gate electrode. Additionally, the first gate layer 240 may serve as a gate barrier layer. Alternatively, the first gate layer 240 and the second gate layer 250 may be a single layer.

Substrate 210 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof. Substrate 210 can be of any size, for example a 200 mm (millimeter) substrate, a 300 mm substrate, or an even larger substrate. In one example, substrate 210 includes a tensile-strained Si layer.

The first gate layer 240 may include one or more metal-containing layers, such as sub-layers 240A and 240B. The thickness of the first gate layer 240 may be several hundred Angstrom (Å), e.g., about 100 Å, 200 Å, 300 Å, 400 Å, etc. The first gate layer 240, as well as sub-layers thereof, may comprise a metal, a metal alloy, a metal nitride, or a metal oxide. For example, first gate layer 240 can contain titanium, titanium alloy, titanium aluminum alloy, tantalum, tantalum alloy, tantalum aluminum alloy, aluminum, aluminum alloy, titanium nitride, titanium silicon nitride, titanium aluminum nitride, tantalum nitride, tantalum silicon nitride, hafnium nitride, hafnium silicon nitride, aluminum nitride, or aluminum oxide. Additionally, the first gate layer 240 in the gate electrode can replace or be integrated with a traditional poly-Si gate electrode layer.

The second gate layer 250 may include a low resistance metal or metal alloy. For example, the second gate layer 250 may include a tungsten-containing layer, such as tungsten, tungsten alloy, or tungsten nitride.

While not shown in FIGS. 2A through 2E, the first gate layer 240 and the second gate layer 250 may be incorporated within a differential metal gate structure that comprises a first thickness for a first region on the substrate 210 and a second thickness for a second region on the substrate 210. The first thickness and the second thickness may be different. The first thickness of the first gate layer 240 at the first region may correspond to an nFET (negative channel field effect transistor) device, and the second thickness of the metal gate layer 240 at the second region may correspond to a pFET (positive channel FET) device, for example.

Figure 2A:
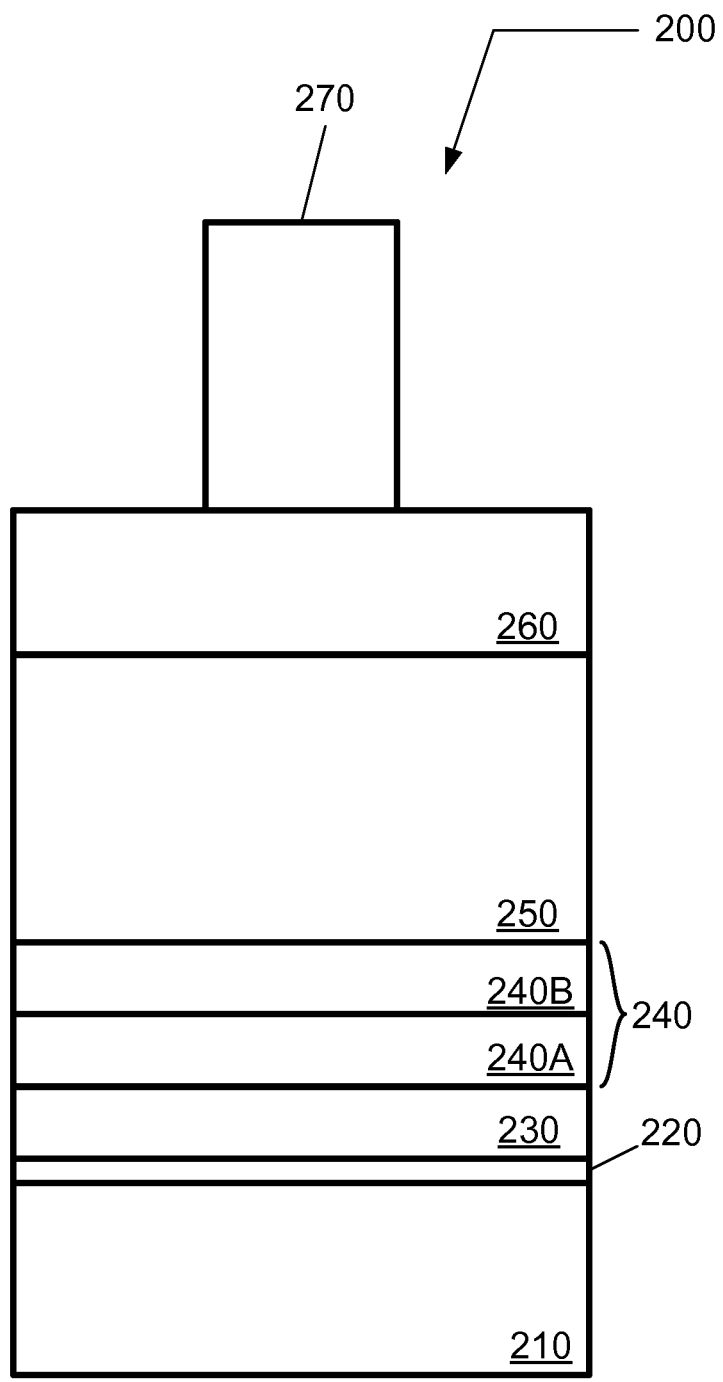
FIGS. 2A through 2E illustrate a schematic representation of a procedure for etching a gate stack on a substrate according to an embodiment.

As illustrated in FIG. 2A, the gate dielectric including high-k layer 230 may further include an interfacial layer 220, such as a thin layer of silicon dioxide ($SiO_2$) between the high-k layer 230 and the substrate 210. The high-k layer 230 may, for example, comprise a lanthanum-containing layer, such as lanthanum oxide (LaO), or a hafnium containing layer, such as a hafnium oxide layer (e.g., $HfO_x$, $HfO_2$), a hafnium silicate layer (e.g., HfSiO), or a nitrided hafnium silicate (e.g., HfSiO(N)). Additionally, for example, the high-k layer 230 may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). Furthermore, for example, the high-k layer 230 may include mixed rare earth oxides, mixed rare earth aluminates, mixed rare earth nitrides, mixed rare earth aluminum nitrides, mixed rare earth oxynitrides, or mixed rare earth aluminum oxynitrides.

A mask layer 270 with a pattern is prepared overlying the gate structure 200. The mask layer 270 may include a layer of radiation-sensitive material or photo-resist having a pattern formed therein using a photo-lithographic process or other lithographic process (e.g., electron beam lithography, imprint lithography, etc.). Additionally, for example, the mask layer 270 of the gate structure 200 may include a second layer, and even a third layer. For example, the mask layer 270 may include an anti-reflective coating (ARC) layer to provide, among other things, anti-reflective properties for the lithographic patterning of the layer of radiation-sensitive material to form the pattern.

The mask layer 270 may further include one or more soft mask layers, and/or one or more organic planarization layers (OPL) or organic dielectric layers (ODL). Further yet, the gate structure 200 may include one or more hard mask layers 260, such as a silicon dioxide ($SiO_2$) hard mask for dry etching the second gate layer 250. The pattern is formed in mask layer 270 utilizing one or more lithographic processes and optionally one or more mask etching processes, and then is transferred to the one or more hard mask layers 260 for patterning the underlying gate structure 200.

Figure 2B:
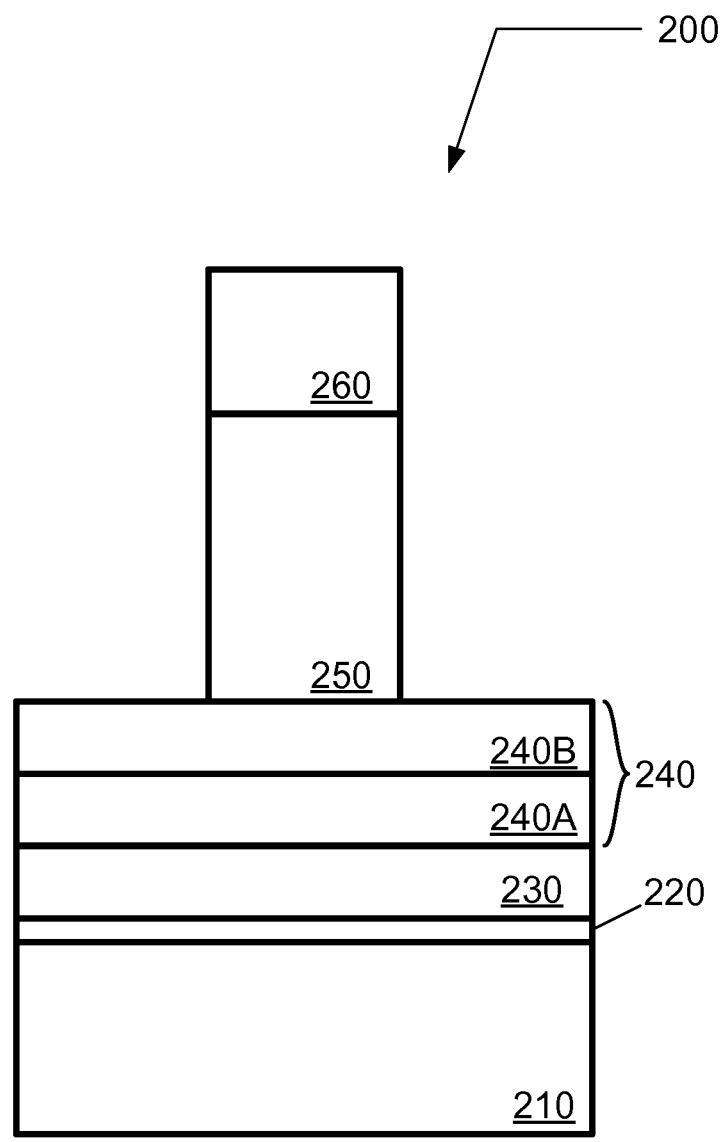
Figure 2C:
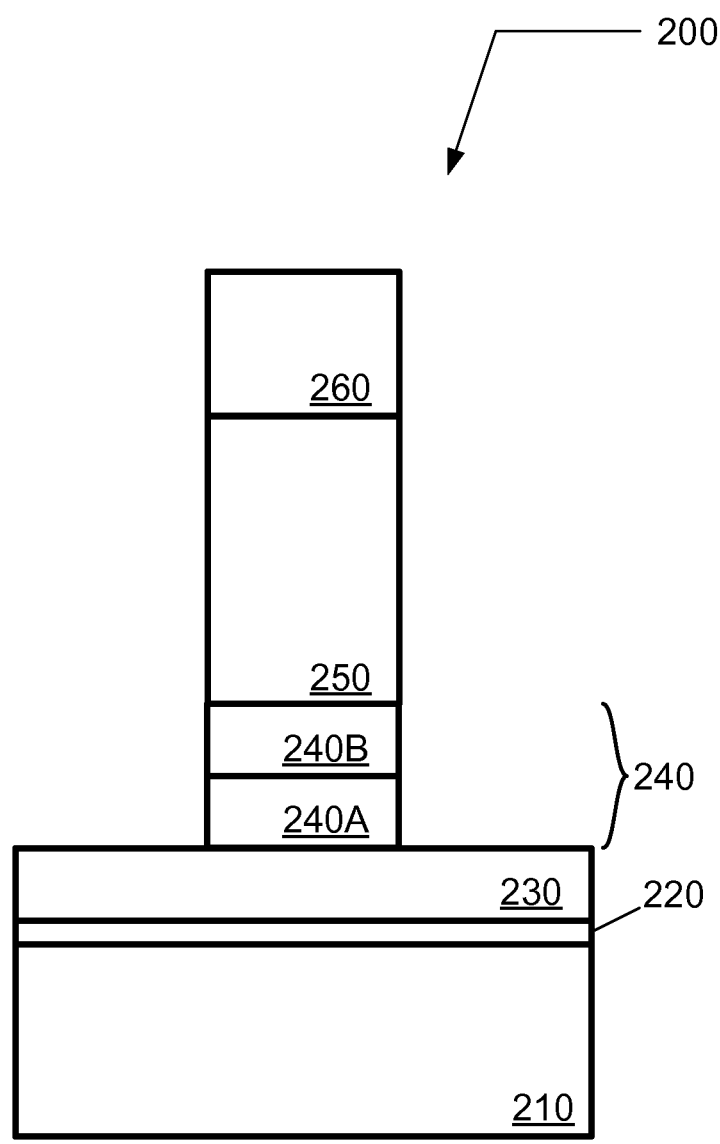

As illustrated in FIGS. 2B and 2C, a series of etching processes for transferring the pattern defined in mask layer 270 to the underlying stack of films to form a patterned gate structure is selected to preserve the integrity of the pattern being transferred, e.g., critical dimensions, etc., as well as minimize damage to those layers which are utilized in the electronic device being fabricated.

As illustrated in FIG. 2B, the pattern in mask layer 270, which has been transferred to the one or more hard mask layers 260, is transferred to the second gate layer 250 using one or more second gate layer etching processes. The one or more second gate layer etching processes may comprise at least one etch step that includes forming plasma using a halogen-containing gas and an optional additive gas having: C and F; C, H, and F; or N and F, as atomic constituents. The one or more second gate layer etching processes may further include a noble gas. The halogen-containing gas may include one or more gases selected from the group consisting of $Cl_2$, $Br_2$, HBr, HCl, and $BCl_3$. Furthermore, the optional additive gas may include one or more gases selected from the group consisting of $CF_4$, $C_4F_8$, $C_4F_6$, $C_5F_8$, $NF_3$, $CH_2F_2$, $CH_3F$, and $CHF_3$. For example, the one or more second gate layer etching processes may include using $Cl_2$, $CF_4$, and Ar. Additionally, for example, the one or more second gate layer etching processes may include using $Cl_2$, $CH_2F_2$, and Ar.

As illustrated in FIG. 2C, the pattern in the second gate layer 250 is transferred to the first gate layer 240 using one or more first gate layer etching processes. The one or more first gate layer etching processes may comprise at least one etch step that includes forming plasma using a halogen-containing gas and an optional additive gas. The one or more first gate layer etching processes may further include a noble gas. The halogen-containing gas may include one or more gases selected from the group consisting of $Cl_2$, $Br_2$, HBr, HCl, and $BCl_3$. For example, the one or more first gate layer etching processes may include a single first gate layer etching process using a first halogen-containing gas, a second halogen-containing gas, and a noble gas. Additionally, for example, the one or more first gate layer etching processes may include using $Cl_2$, $BCl_3$, and Ar.

Figure 2D:
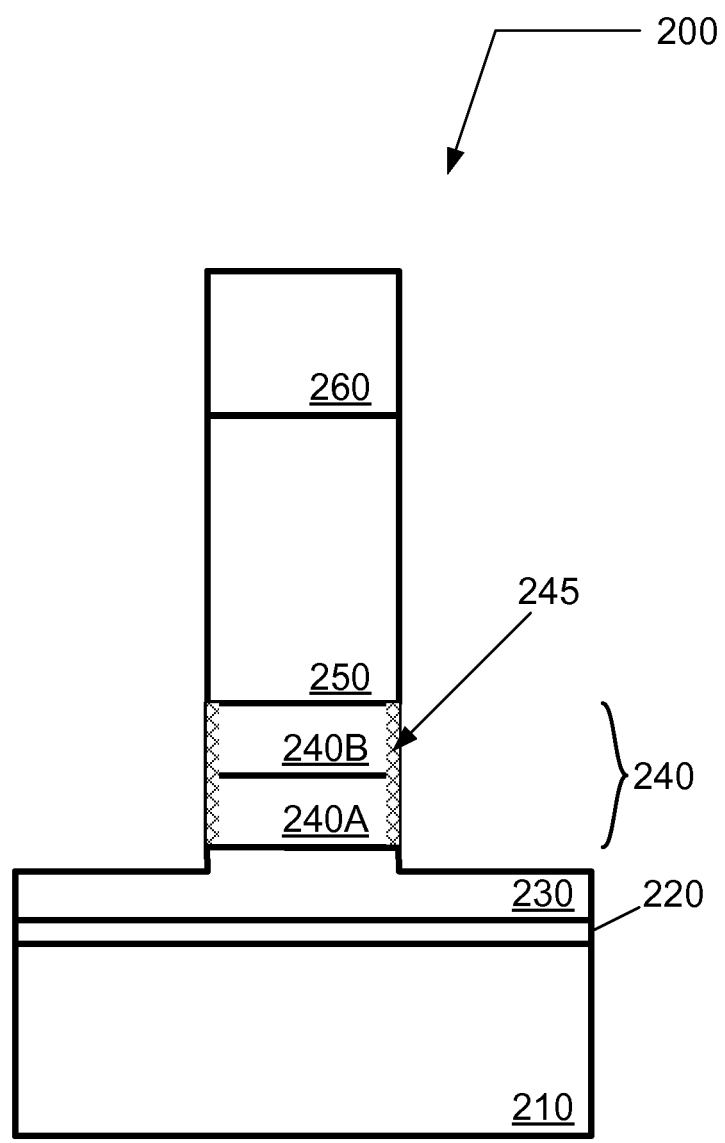
Figure 2E:
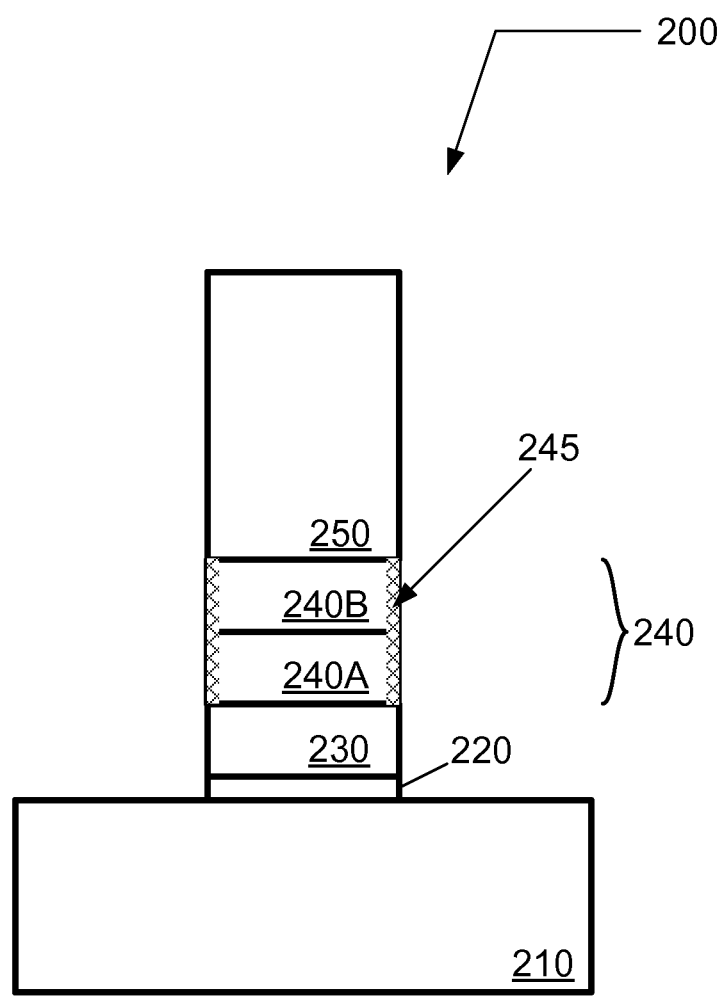
Figure 3:
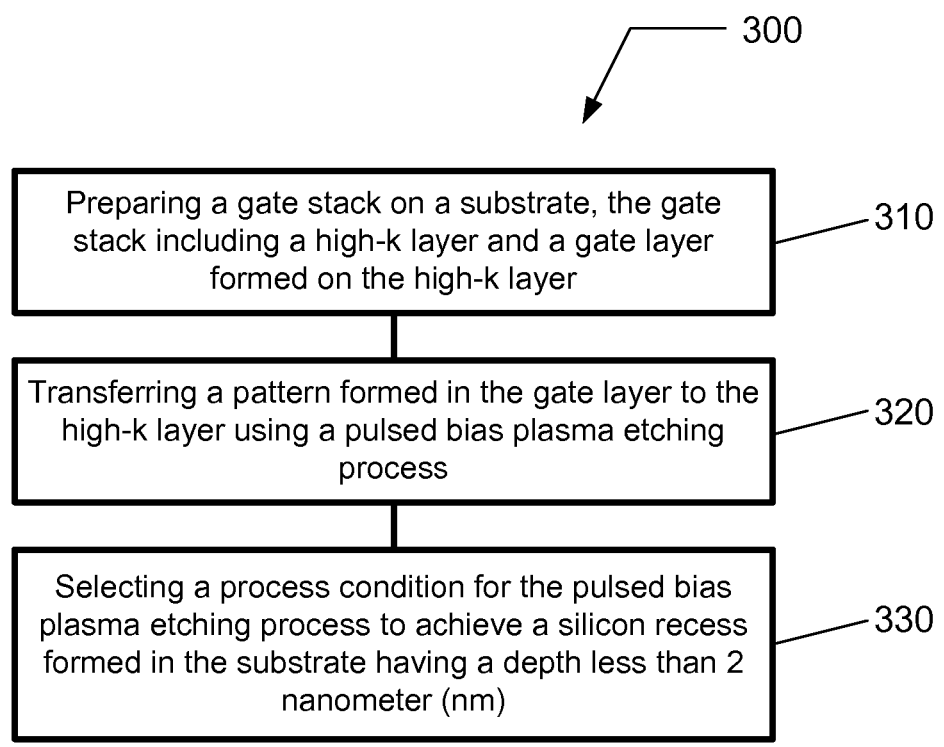
FIG. 3 provides a flow chart illustrating a method of etching a gate stack on a substrate according to an embodiment.

In 320, as shown in FIG. 3 and illustrated in FIGS. 2D and 2E, the pattern in the first gate layer 240 is transferred to the high-k layer 230 using one or more high-k layer etching processes. The one or more high-k layer etching processes comprises a pulsed bias plasma etching process. The pulsed bias plasma etching process includes: forming plasma using a process gas composition including a halogen-containing gas and a polymerizing gas, wherein the polymerizing compound contains a hydrocarbon; electrically biasing a substrate holder that supports the substrate with radio frequency (RF) power; and pulsing the RF power for the electrical biasing. The inventors suspect that pulsed bias etching of the high-k layer causes switching between an etch mode for patterning and removing any footing in the high-k layer, and a deposition mode for protecting or passivating, among other things, the exposed sidewalls 245 of the first gate layer 240.

The halogen-containing gas may include a fluorine-containing compound, a chlorine-containing compound, a bromine-containing compound, a halide, or a halomethane, or any combination of two or more thereof. The halogen-containing gas may include $BCl_3$. The halogen-containing gas may further include $Cl_2$, $Br_2$, or $F_2$, or any combination of two or more thereof. The polymerizing gas may include at least one of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$. The polymerizing gas may include $CH_2F_2$, $CH_3F$, or $CHF_3$. The process composition may further include a noble gas.

In one embodiment, the process composition comprises $BCl_3$ and $C_2H_4$. In another embodiment, the process composition consists of $BCl_3$, $C_2H_4$, and an optional noble gas.

During the pulsed bias plasma etching process, at least one property of the pulsing of RF power may be adjusted. The at least one property may include a pulse amplitude, a pulse frequency, a pulse duty cycle, a pulse waveform, or a pulse phase. In one embodiment, the pulsing of RF power for the electrical biasing comprises pulsing the RF power between an off-state and an on-state.

In one embodiment, the pulsed bias plasma etching process may comprise a process parameter space that includes: a chamber pressure ranging up to about 1000 mtorr (millitorr) (e.g., up to about 200 mtorr, or up to about 50 to 150 mtorr), a halogen-containing gas flow rate ranging up to about 2000 sccm (standard cubic centimeters per minute) (e.g., up to about 1000 sccm, or about 1 sccm to about 200 sccm), a polymerizing gas flow rate ranging up to about 2000 sccm (e.g., up to about 1000 sccm, or about 1 sccm to about 100 sccm), an optional noble gas (e.g., He or Ar) flow rate ranging up to about 2000 sccm (e.g., up to about 1000 sccm), an upper electrode (e.g., element 770 in FIG. 7) RF power ranging up to about 2000 W (watts) (e.g., up to about 1000 W, or up to about 600 W), a lower electrode (e.g., element 522 in FIG. 7) RF bias ranging up to about 1000 W (e.g., up to about 600 W, or up to about 100 W, or up to 50 W), a lower electrode pulse frequency ranging up to about 1000 Hz (e.g., up to about 100 Hz, or up to about 10 Hz, or up to 1 Hz), and a lower electrode pulse duty cycle ranging from about 1:4 (20%-ON/80%-OFF) to about 4:1 (80%-ON/20%-OFF) (e.g., from about 1:2 to about 2:1, or about 1:1 (50%-ON/50%-OFF)). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Figure 4A:
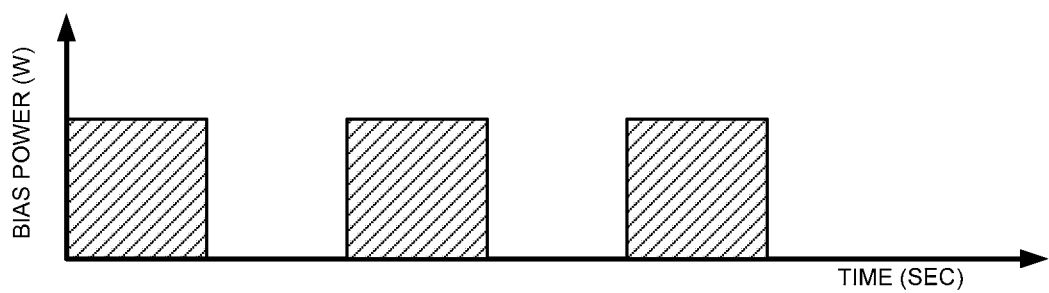
FIGS. 4A through 4G provide a schematic graphical representation of a method of etching a gate stack on a substrate according to other embodiments.
Figure 4B:
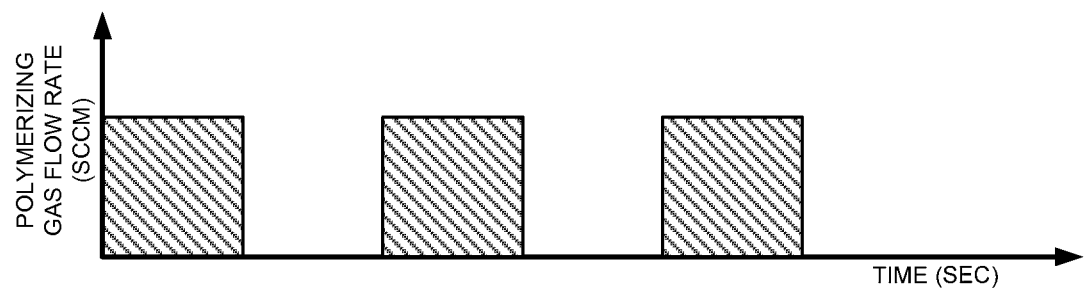
Figure 4C:
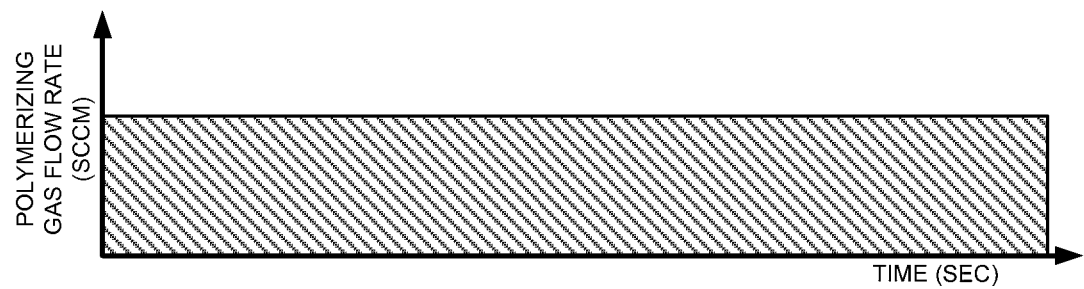
Figure 4D:
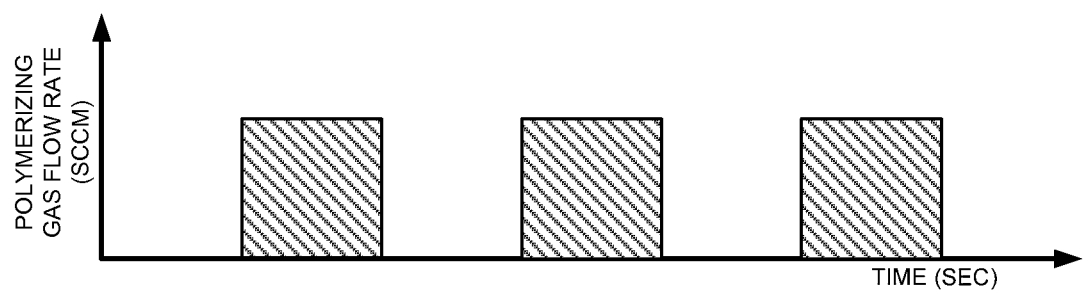
Figure 4E:
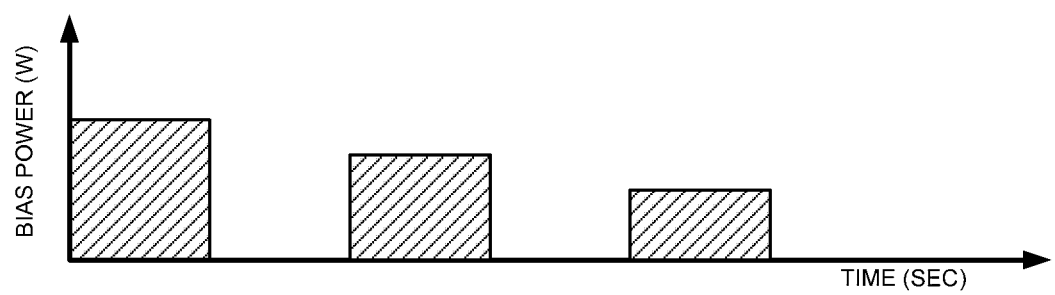

Turning now to the graphical illustrations of FIGS. 4A through 4E, several embodiments are provided for pulsing the RF power and introducing the polymerizing gas. As shown in FIGS. 4A and 4B, the polymerizing gas is introduced as a pulsed flow that is substantially in-phase with the pulsing of RF power (i.e., polymerizing gas is introduced during RF power on-state). Alternatively, as shown in FIGS. 4A and 4C, the polymerizing gas is introduced as a continuous flow during the pulsing of RF power (i.e., polymerizing gas is introduced during RF power on- and off-states). Alternatively yet, as shown in FIGS. 4A and 4D, the polymerizing gas is introduced as a pulsed flow that is substantially out-of-phase with the pulsing of RF power (i.e., polymerizing gas is introduced during RF power off-state). The polymerizing gas may be introduced as a pulsed flow that is substantially out-of-phase with the pulsing of RF power, yet there may be some overlap. Further, as shown in FIG. 4E, the RF power level (or RF amplitude) may be varied from one pulse to the next pulse. For example, the RF power level may be ramped downward or decreased during the electrical biasing of the substrate.

In one embodiment, the pulsing of RF power for the electrical biasing may include: (i) pulsing the RF power at a first RF power level for a first time duration; and (ii) pulsing the RF power at a second RF power level for a second time duration, wherein the second RF power level is less than the first RF power level, and the second time duration follows the first time duration. In another embodiment, the pulsing of RF power for the electrical biasing may further include: (iii) pulsing the RF power at a third RF power level for a third time duration, wherein the third RF power level is less than the second RF power level, and the third time duration follows the second time duration.

In yet another embodiment, the pulsing of RF power for the electrical biasing may include: (i) pulsing the RF power at a first RF power level for a first time duration; (ii) pulsing the RF power at a second RF power level for a second time duration, wherein the second RF power level is less than the first RF power level, and the second time duration follows the first time duration; and (iii) terminating the pulsing of power for a third time duration, wherein the third time duration follows the second time duration.

In 330, a process condition is selected for the pulsed bias plasma etching process to achieve a recess formed in substrate 210 having a depth less than 2 nanometer (nm). Alternatively, a process condition is selected for the pulsed bias plasma etching process to achieve a recess formed in substrate 210 having a depth less than 1 nm.

Figure 4F:
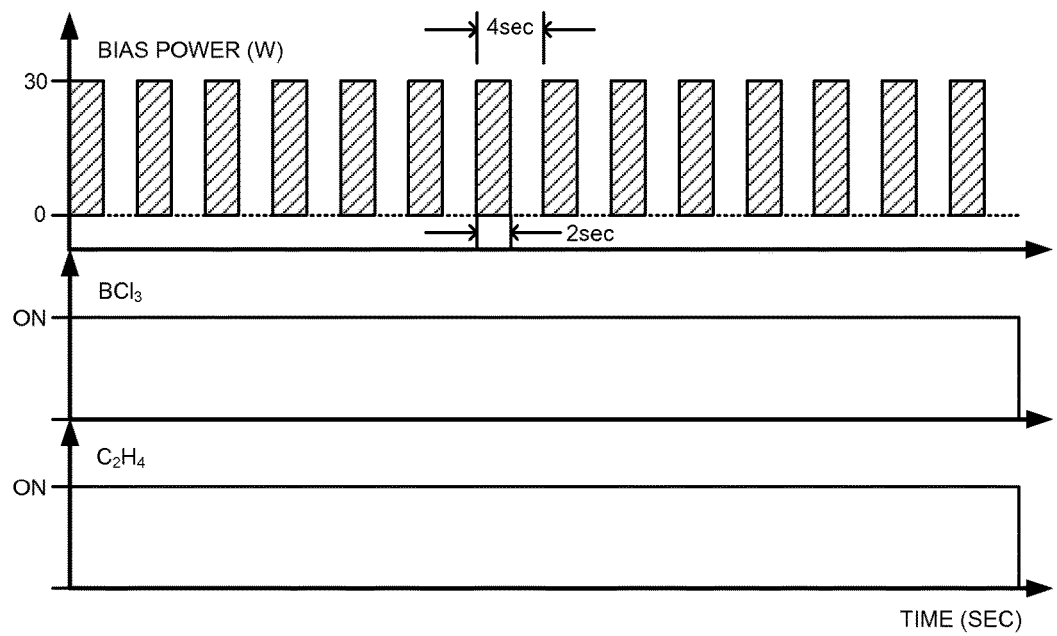
Figure 4G:
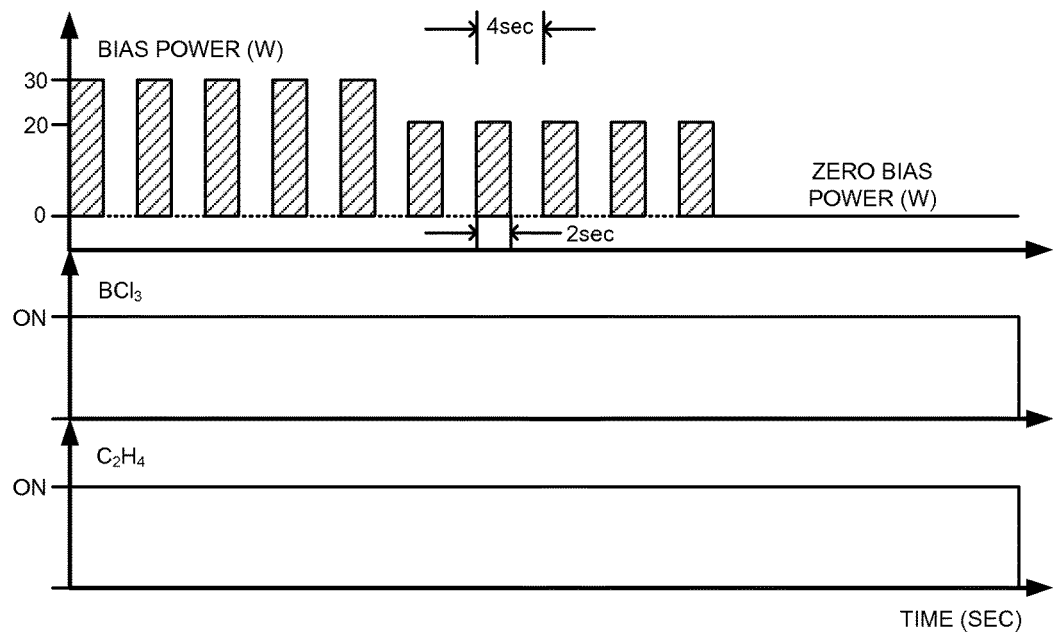

As an example, Table 1 provides exemplary process conditions for patterning a gate structure on a tensile-strained Si—Ge substrate using two different pulsed bias plasma etching processes. The performance for each pulsed bias plasma etching process is assessed via measurement of the under-cutting in the gate layer overlying the high-k layer, the footing in the high-k layer, and the recess in the substrate. The high-k layer contains Hf, and the gate layer contains Ta. The pulsed bias plasma etching processes include: (A) a first etching process with fourteen (14) pulse cycles at a constant RF power level (i.e., constant amplitude during the on-state) (see FIG. 4F); and (B) a second etching process with five (5) pulse cycles at a first RF power level (i.e., first amplitude for the on-state), five (5) pulse cycles at a second RF power level (i.e., second amplitude for the on-state), and the equivalent of four (4) pulse cycles with the RF power to the lower electrode terminated or off (see FIG. 4G); wherein during pulsing the RF power is switched between an on- and off-state.

TABLE 1

| Etching Process | UEL RF POWER (W) | ON-STATE LEL RF POWER (W) | ON-STATE LEL RF TIME (SEC) | OFF-STATE LEL RF POWER (W) | OFF-STATE LEL RF TIME (SEC) | NO. OF CYCLES | BCl₃ | C₂H₄ | He | SUBSTRATE TEMP. (DEG. C.) | UNDER-CUT | FOOTING | RECESS (nm) |
|---|---|---|---|---|---|---|---|---|---|---|---|---|---|
| 1 | ON | 30 | 2 | 0 | 2 | 14 | ON | ON | ON | >200 | None | None | 3.3 |
| 2a | ON | 30 | 2 | 0 | 2 | 5 | ON | ON | ON | >200 | None | None | 0.9 |
| 2b | ON | 20 | 2 | 0 | 2 | 5 | ON | ON | ON | >200 | | | |
| 2c | ON | 0 | 2 | 0 | 2 | 4 | ON | ON | ON | >200 | | | |

For the first (1) and second (2a-c) etching processes, a process condition is recited including an upper electrode (UEL) radio frequency (RF) power (watts, W; indicated as ON or OFF), a lower electrode (LEL) RF power level for the on-state (watts, W), a lower electrode (LEL) RF power time duration for the on-state (seconds, sec), a lower electrode (LEL) RF power level for the off-state (watts, W), a lower electrode (LEL) RF power time duration for the off-state (sec), a number of cycles, a BCl₃ flow rate (ON or OFF), a C₂H₄ flow rate, a He flow rate, and a substrate temperature (° C., deg. C.).

In both pulsed bias plasma etching processes, the inventors observe negligible under-cutting of the gate layer overlying the high-k layer, as well as negligible footing in the high-k layer. Furthermore, the inventors observe a reduction in the recess to approximately 3.3 nm, and even less than 1 nm, when using the first and second pulsed bias etching processes, respectively. The inventors suspect that pulsed bias etching of the high-k layer causes switching between an etch mode for patterning and removing any footing in the high-k layer, and a deposition mode for protecting or passivating the exposed sidewalls of the overlying gate layer. Furthermore, the inventors suspect that ramping down or decreasing the RF power level for the pulsed biasing "softens the landing" when the respective etching process extends through the high-k layer and reaches the underlying substrate.

In other alternate embodiments, RF power may be supplied to the lower electrode and not the upper electrode. In yet other alternate embodiments, RF power and/or DC power may be coupled in any of the manners described through FIGS. 5 to 11.

The time duration to perform a specific etching process may be determined using design of experiment (DOE) techniques or prior experience; however, it may also be determined using optical detection. One possible method of optical detection is to monitor a portion of the emitted light spectrum from the plasma region that indicates when a change in plasma chemistry occurs due to a change in the etching process. After emission levels corresponding to the monitored wavelengths cross a specified threshold (e.g., decrease below a particular level, or increase above a particular level), a transition point in the etching process can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with transition detection.

Figure 6:
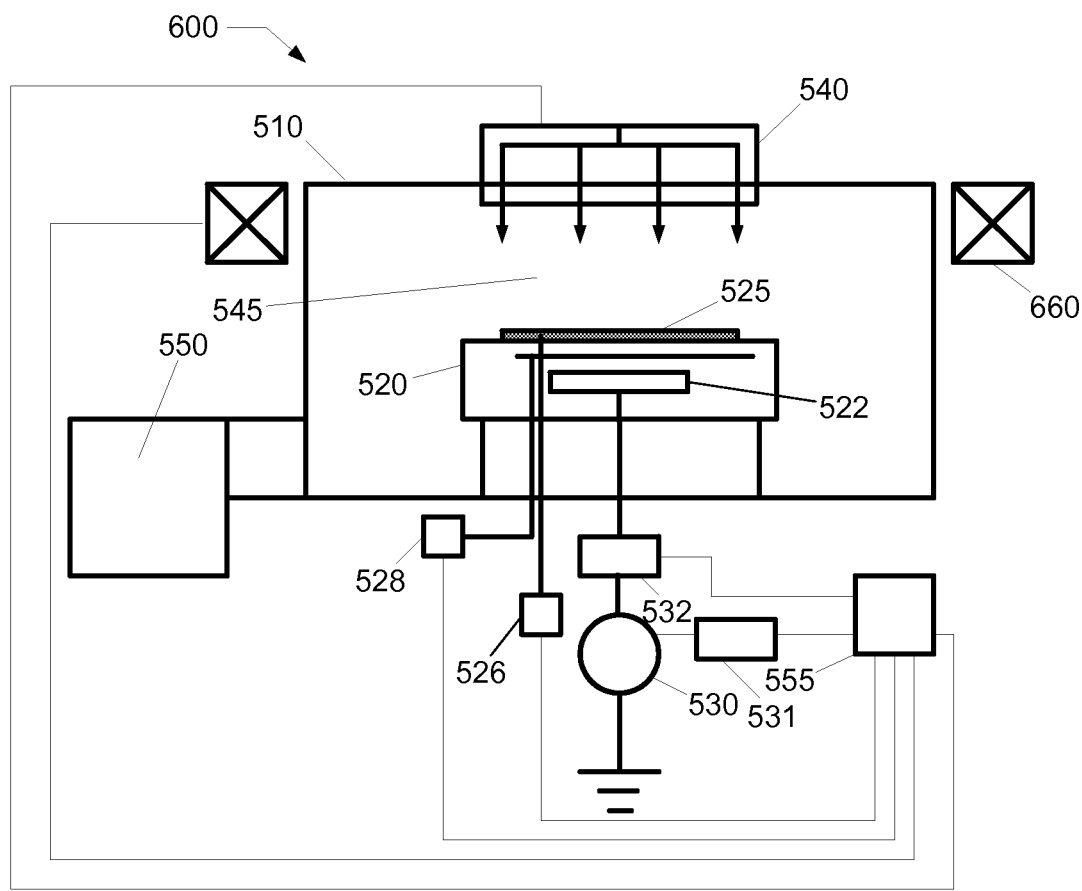
FIG. 6 shows a schematic representation of a plasma processing system according to another embodiment.
Figure 7:
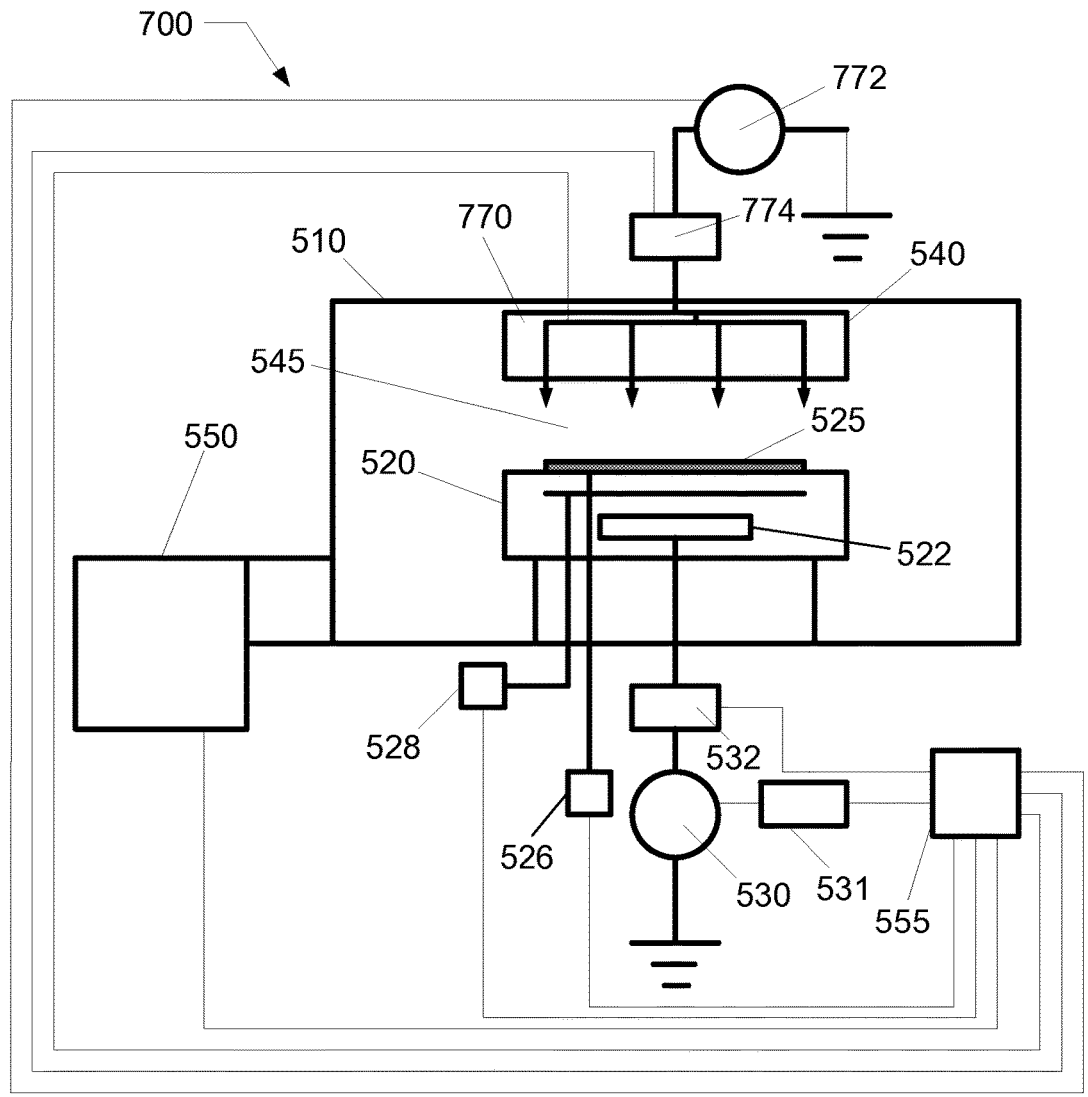
FIG. 7 shows a schematic representation of a plasma processing system according to another embodiment.

One or more of the methods for patterning a gate stack described above may be performed utilizing a plasma processing system such as the one described in FIG. 7. However, the methods discussed are not to be limited in scope by this exemplary presentation. The method of patterning a gate stack on a substrate according to various embodiments described above may be performed in any one of the plasma processing systems illustrated in FIGS. 5 through 11 and described below.

Figure 5:
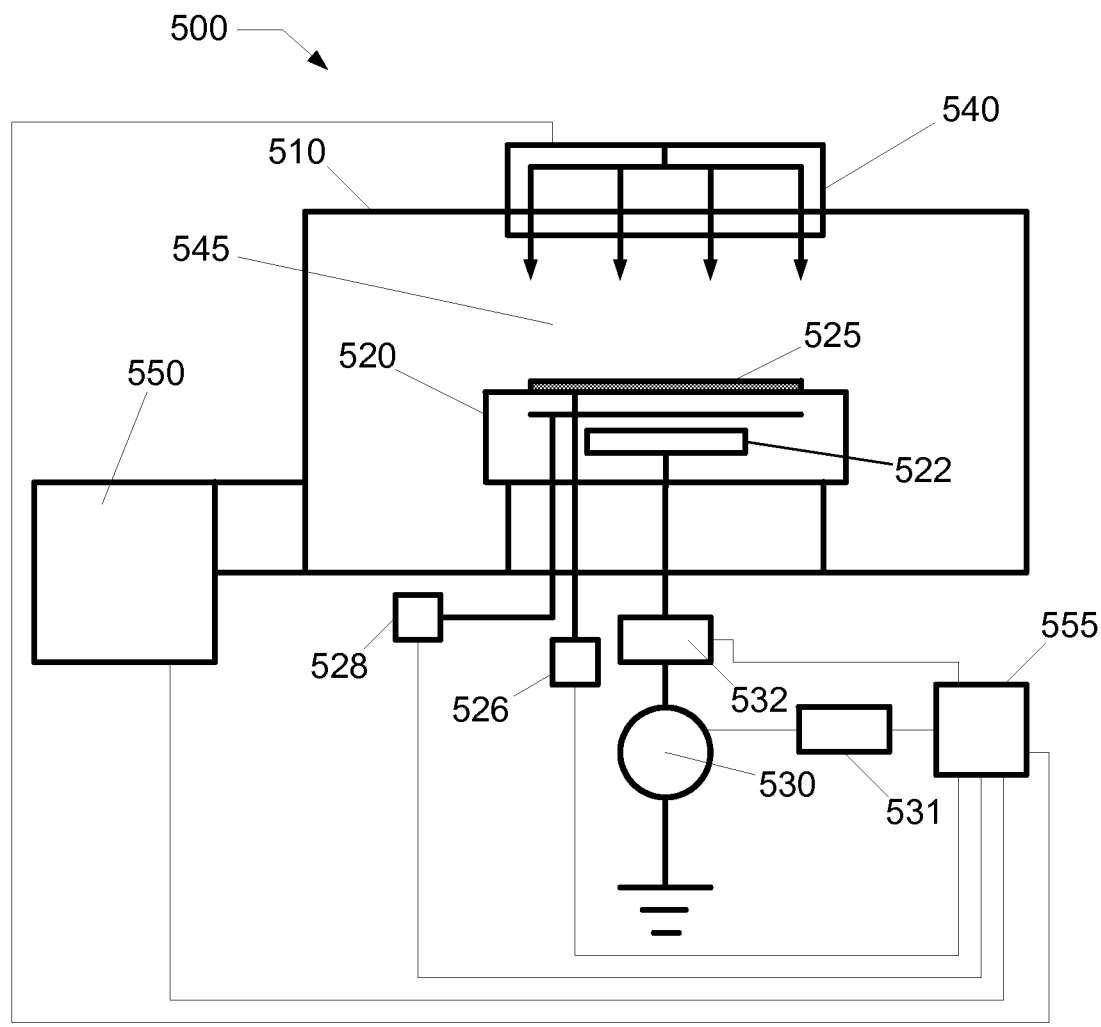
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein a helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
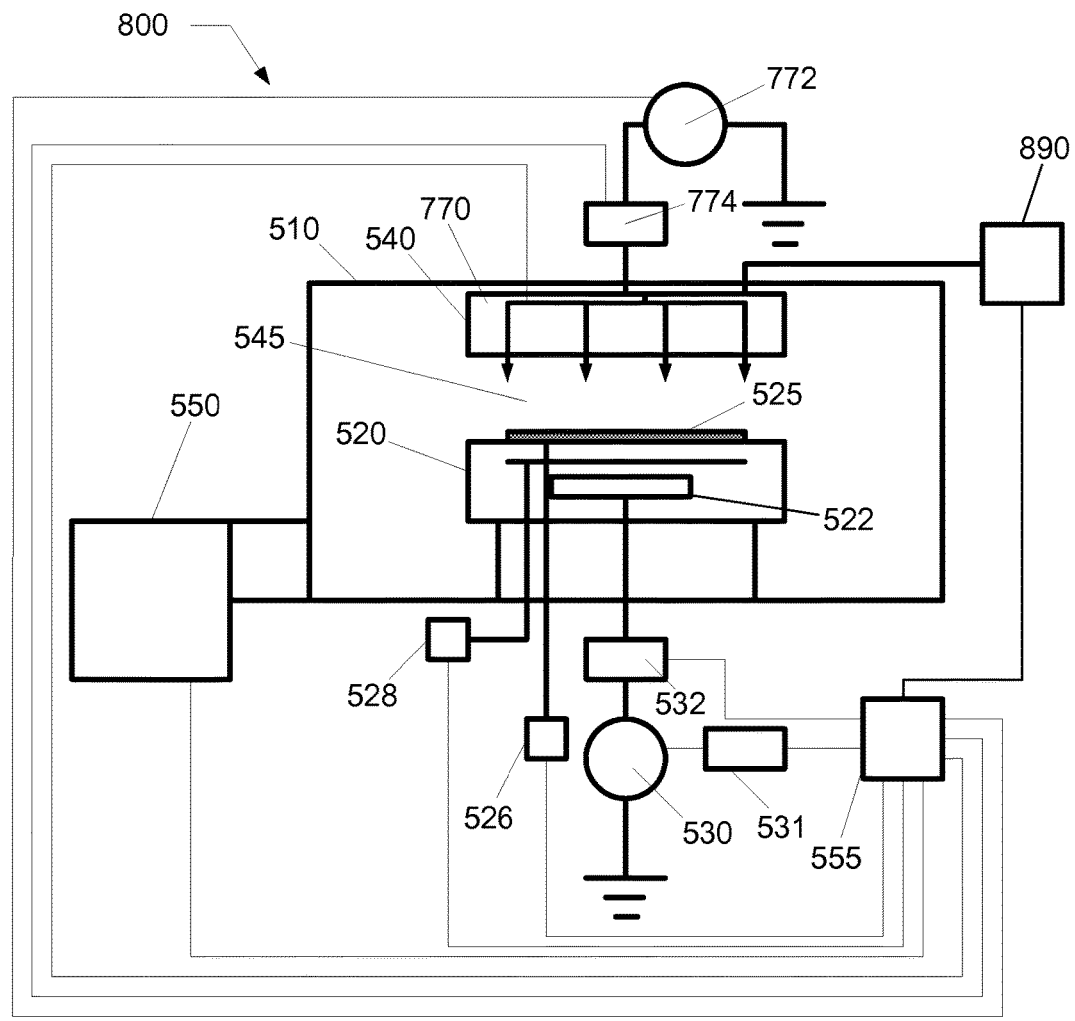
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
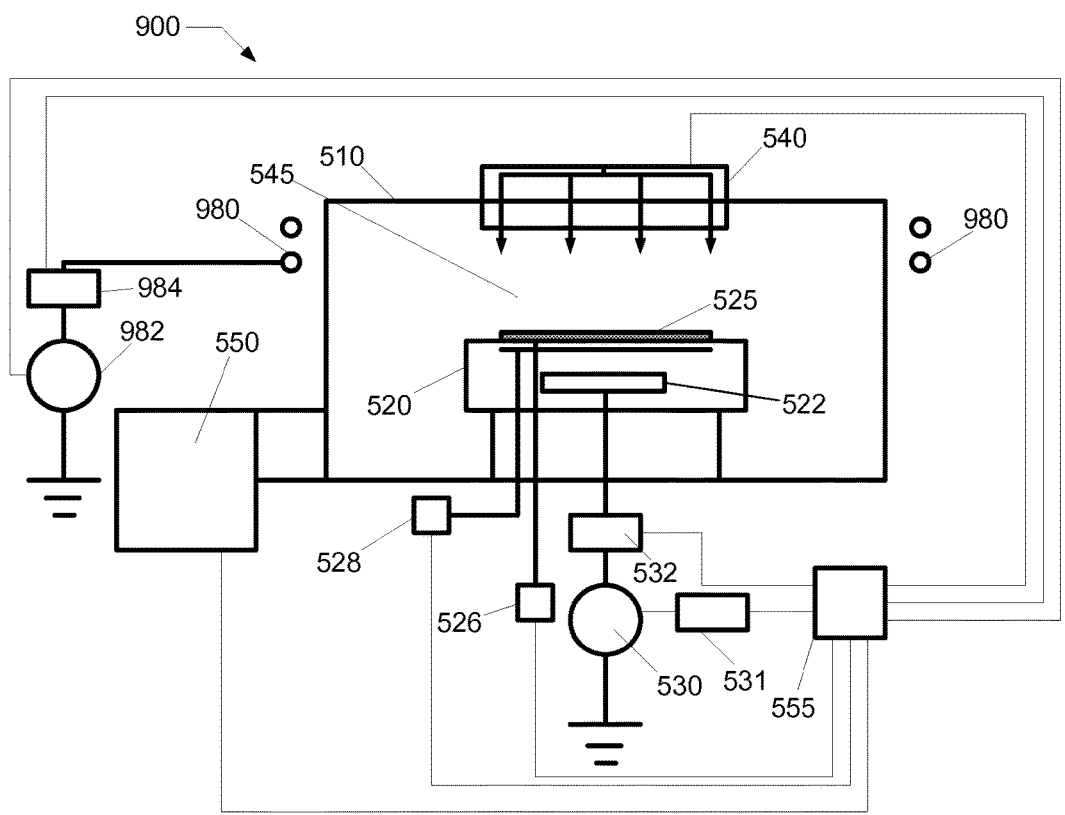
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
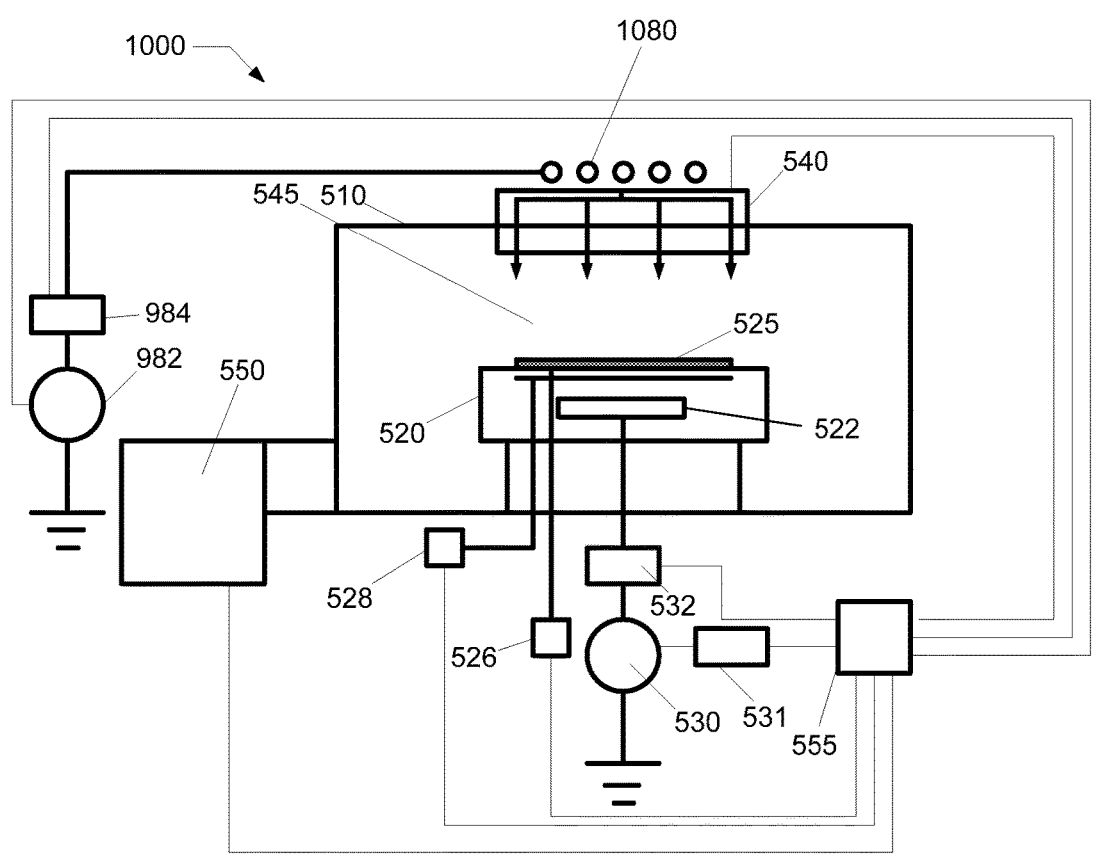
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
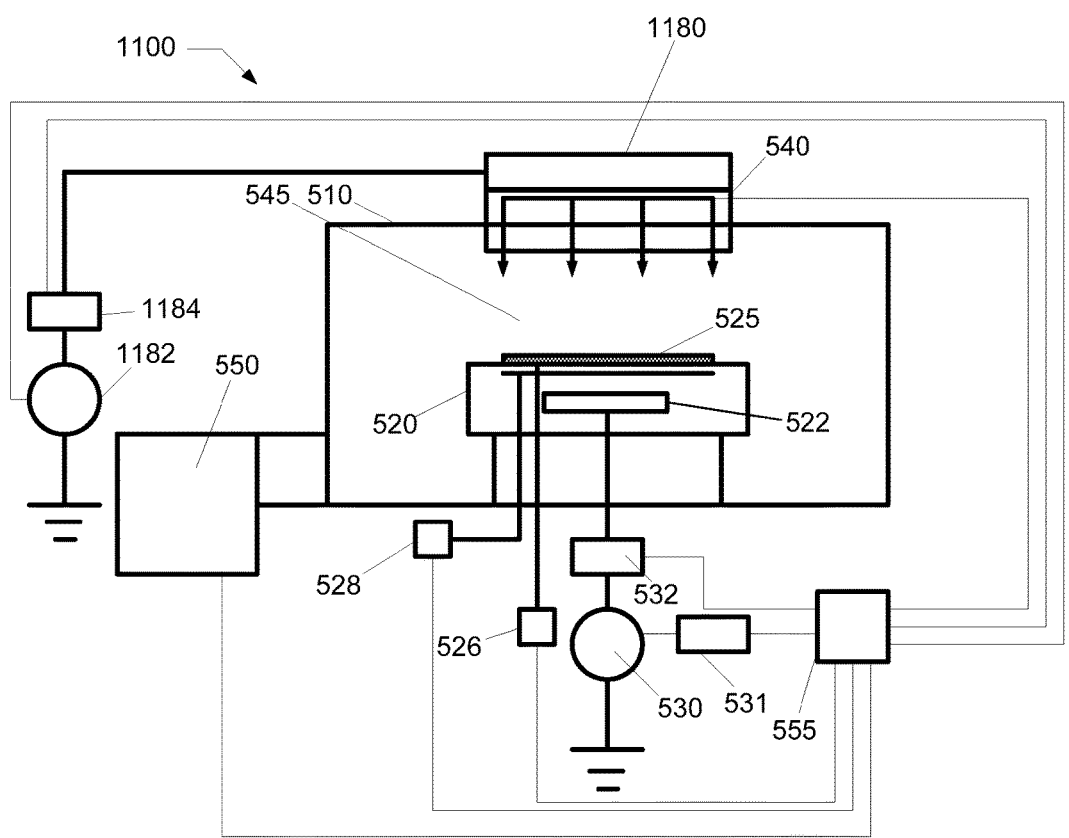
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1180. The SWP source 1180 can comprise a slot antenna, such as a radial line slot antenna (RLSA), to which microwave power is coupled via microwave generator 1182 through optional impedance match network 1184.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of patterning etching a layer on a substrate, comprising:
    disposing a substrate in a plasma processing system; and
    transferring a pattern to at least one layer on said substrate using a pulsed plasma etching process, said pulsed plasma etching process comprising:
    introducing a flow of a process gas composition to said plasma processing system;
    generating plasma in said plasma processing system;
    electrically biasing a substrate holder that supports said substrate with radio frequency (RF) power; and
    modulating said RF power for said electrical biasing of the substrate holder by modulating RF power to said substrate holder with pulses that change between an off-state and an on-state and by varying an RF power level to provide at least one first pulse in an on-state at a first RF power level for a first time duration and then to an off-state, and subsequently provide at least one second pulse in an on-state at a second RF power level for a second time duration.

2. The method of claim 1, wherein said second RF power level is less than said first RF power level and said second time duration follows said first time duration.

3. The method of claim 2, wherein said modulating said RF power for said electrical biasing further comprises:
terminating said modulating said RF power for a third time duration, said third time duration following said second time duration.

4. The method of claim 1, further comprising modulating a flow of said process composition.

5. The method of claim 1, further comprising:
selecting a process condition for said pulsed plasma etching process and controlling a profile of said pattern transferred to said at least one layer, said process condition including setting a pulse amplitude, a pulse frequency, a pulse duty cycle, or a pulse waveform, or any combination thereof.

6. The method of claim 1, wherein said process composition includes a halogen-containing compound.

7. The method of claim 6, wherein said halogen-containing compound further comprises a halide or a halomethane.

8. The method of claim 6, wherein said halogen-containing compound further comprises $Cl_2$, $Br_2$, or $F_2$, or any combination of two or more thereof.

9. The method of claim 6, wherein said process composition further includes a polymerizing compound.

10. The method of claim 9, wherein said polymerizing compound includes at least one of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$.

11. The method of claim 1, wherein said process composition comprises a noble gas.

12. The method of claim 1, wherein said process composition is continuously flowed into said plasma processing system during said pulsed plasma etching process.

13. The method of claim 1, wherein at least one constituent of said process composition is modulated into said plasma processing system during said pulsed plasma etching process.

14. The method of claim 13, wherein said modulated flow of said at least one constituent of said process composition is in-phase or out-of-phase with modulating said RF power.

15. The method of claim 14, further comprising:
adjusting at least one property of said modulating said RF power, said at least one property including a pulse phase difference between said modulating of said RF power and said modulating said at least one constituent of said process composition.

16. The method of claim 1, wherein said modulating said RF power for said electrical biasing further comprises:
modulating said RF power with at least one pulse in an on-state at a third RF power level for a third time duration, wherein said third RF power level is less than said second RF power level, and said third time duration follows said second time duration.

17. The method of claim 1, wherein said modulating said RF power for said electrical biasing further comprises:
decreasing a RF power level for said modulating said RF power.

18. The method of claim 1, wherein generating plasma in said plasma processing system is performed using a surface wave plasma source, said surface wave plasma source comprises a slot antenna.

19. The method of claim 18, wherein said surface wave plasma source comprises a radial line slotted antenna.

20. The method of claim 19, wherein said radial line slotted antenna couples microwave power from a microwave generator to said plasma.

21. The method of claim 1, wherein generating plasma in said plasma processing system is performed using an inductively coupled plasma source.

22. The method of claim 21, wherein the inductively coupled plasma source comprises an inductive coil that couples power to the plasma.

23. The method of claim 22, wherein the inductive coil couples power to the plasma in a frequency range from about 10 MHz to about 100 MHz.

* * * * *

UNITED STATES PATENT AND TRADEMARK OFFICE
CERTIFICATE OF CORRECTION

PATENT NO. : 10,290,506 B2
APPLICATION NO. : 15/431049
DATED : May 14, 2019
INVENTOR(S) : Alok Ranjan et al.

Page 1 of 1

It is certified that error appears in the above-identified patent and that said Letters Patent is hereby corrected as shown below:

In the Claims

Column 12, Line 48, Claim 1, change "A method of patterning etching a layer on" to --A method of pattern etching a layer on--.

Signed and Sealed this
Sixth Day of August, 2019

Andrei Iancu
*Director of the United States Patent and Trademark Office*